(12) United States Patent
Sato et al.

(10) Patent No.: US 7,981,326 B2
(45) Date of Patent: *Jul. 19, 2011

(54) SILVER FINE POWDER, PROCESS FOR PRODUCING THE SAME, AND INK

(75) Inventors: Kimitaka Sato, Okayama (JP); Taku Okano, Okayama (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 13 days.

This patent is subject to a terminal disclaimer.

(21) Appl. No.: 12/522,422

(22) PCT Filed: Jan. 8, 2008

(86) PCT No.: PCT/JP2008/050308
§ 371 (c)(1),
(2), (4) Date: Jul. 8, 2009

(87) PCT Pub. No.: WO2008/084866
PCT Pub. Date: Jul. 17, 2008

(65) Prior Publication Data
US 2010/0006002 A1    Jan. 14, 2010

(30) Foreign Application Priority Data
Jan. 9, 2007 (JP) ................. 2007-001298
Jul. 2, 2007 (JP) ................. 2007-173732

(51) Int. Cl.
*H01B 1/22* (2006.01)
(52) U.S. Cl. ......... 252/514; 428/402; 428/403; 428/407
(58) Field of Classification Search ............. 252/514; 428/402, 403, 407
See application file for complete search history.

(56) References Cited

U.S. PATENT DOCUMENTS

| 7,491,257 B2 * | 2/2009 | Sato ................ 75/255 |
| 7,776,442 B2 * | 8/2010 | Sato ................ 428/402 |
| 2005/0257643 A1 * | 11/2005 | Ogi et al. ............ 75/255 |
| 2005/0279970 A1 * | 12/2005 | Ogi et al. ............ 252/514 |
| 2006/0107791 A1 * | 5/2006 | Fujino et al. ........ 75/365 |
| 2006/0199008 A1 * | 9/2006 | Sato ................ 428/402 |
| 2008/0146680 A1 * | 6/2008 | Sato ................ 516/31 |
| 2009/0236567 A1 * | 9/2009 | Ogi et al. ............ 252/514 |
| 2010/0025639 A1 * | 2/2010 | Ogi et al. ............ 252/514 |
| 2010/0038603 A1 * | 2/2010 | Sato et al. .......... 252/512 |

FOREIGN PATENT DOCUMENTS

| JP | 2005-36309 | 2/2005 |
| JP | 2006-213955 | 8/2006 |
| JP | 2006-219693 | 8/2006 |
| JP | 2006-241494 | 9/2006 |
| WO | 2004/012884 | 2/2004 |
| WO | WO 2006082987 A1 * | 8/2006 |
| WO | WO 2006082996 A1 * | 8/2006 |

OTHER PUBLICATIONS

M. Nakamoto et al., "Application of Silver Nanoparticles to Conductor Pastes", Chemical Industry, Vol. 56, No. 10, 2005, pp. 749-754.

* cited by examiner

*Primary Examiner* — Douglas M C Ginty
(74) *Attorney, Agent, or Firm* — Clark & Brody

(57) ABSTRACT

A silver fine powder comprising silver particles with an average particle diameter of 20 nm or less and having an organic protective material on the surface thereof, wherein the proportion of the organic protective material present is 0.05 to 25% by mass based on the total mass of the silver particles and the organic protective material. An amine compound having a molecular weight of 100 to 1,000 is preferably used as the organic protective material, and that having one or more unsaturated bond in one molecule is particularly preferred. This silver fine powder has, for example, a crystallite diameter in (111) crystal plane of silver particle of 20 nm or less. The present invention further provides an ink comprising particles of the silver fine powder dispersed in an organic solvent in the silver concentration of 10% by mass or more, the ink having a viscosity of 50 mPa·s or less.

8 Claims, 1 Drawing Sheet

SILVER FINE POWDER, PROCESS FOR PRODUCING THE SAME, AND INK

TECHNICAL FIELD

The present invention relates to a silver fine powder suitable for an ink for forming a fine circuit pattern by an inkjet method, a process for producing the same, and the ink.

PRIOR ART

Since metal nanoparticles have high activity, and can be sintered even at low temperatures, they have been regarded for a long time as a patterning material on to a substrate having low heat resistance. In particular, nowadays the production of single nanoclass particles can relatively easily carried out due to the advance in nanotechnology. As such technology, for example, Patent Document 1 discloses a method for synthesizing a large amount of silver nanoparticles using silver oxide as a starting material and using an amine compound. Patent Document 2 discloses a method for synthesizing silver nanoparticles by mixing and melting amine and silver compound raw materials. Non-Patent Document 1 proposes a paste preparation technology using silver nanoparticles.

Patent Document 1: JP-A 2006-219693
Patent Document 2: WO2004/012884, pamphlet
Non-Patent Document 1: Masami Nakamoto et al., *APPLICATION OF SILVER NANOPARTICLES TO CONDUCTIVE PASTE*, Kagaku Kogyo, Kagaku Kogyo-Sha, issued in October 2005, pages 749-754

Problems that the Invention is to Solve

Of the applications of silver nanoparticles, the development of which is expected in the future, mentioned is the application in imperceptible interconnection (in other words, micro wiring) by an inkjet method. The main merit for using nanoparticles in the application of imperceptible interconnection is that finer and narrower-line-interconnection can be drawn as compared the case using the conventional micron order particles. This matches the today's trend in downsizing of apparatuses, and is helpful to realize a substrate having the same properties as the conventional properties in smaller size.

In the inkjet method, formation of imperceptible interconnection is possible, and interconnection itself can directly be drawn (etching is unnecessary). As a result, expensive silver is effectively used. Furthermore, a mask and an etching liquid are unnecessary. However, as the inkjet method is a method of forming lines and faces by superposing extremely microscopic dots, it is desired to use an ink having high silver concentration in order to efficiently obtain suitable interconnection for practical uses.

However, in the prior art, a surfactant present in the ink is disincentive in increasing the concentration of silver particles. That is, where the metal concentration in the ink is attempted to increase, the particles aggregate in a solvent, and it is difficult to make homogeneous dispersion. Thus, it can be said that ensuring dispersibility of particles in an ink and achieving high concentration of metal particles are in an incompatible relationship in the conventional methods. If this problem is solved, it is expected that availability of a silver nano-ink, that is a dispersion of silver nano-sized powder, is drastically enhanced.

In view of the above actual status, the present invention has an object to provide a silver nano-ink having a greatly improved silver concentration while maintaining good dispersibility of silver nanoparticles.

Means for Solving the Problems

To achieve the above object, the present invention provides a silver fine powder comprising silver particles with an average particle diameter of 20 nm or less and having an organic protective material on the surface thereof, wherein the proportion of the organic protective material present is 0.05 to 25% by mass based on the total mass of the silver particles and the organic protective material. An amine compound having a molecular weight of 100 to 1,000 is preferably used as the organic protective material, and a material having one or more unsaturated bond in one molecule is particularly preferred. The silver fine powder has, for example, a crystallite diameter in (111) crystal plane of silver, of 20 nm or less.

The present invention further provides an ink comprising particles of the silver fine powder dispersed in an organic solvent at the silver concentration of 10% by mass or more, the ink having a viscosity of 50 mPa·s or less. The ink having the silver concentration increased to 30% by mass or more, and further increased to 50% by mass or more (for example, an ink having the silver concentration increased to 60% by mass or more and an ink having the silver concentration increased to 70% by mass or more) can be provided. The term "ink" used herein means an ink of silver particles suitable for drawing imperceptible interconnection by an inkjet method.

As a process for producing the silver fine powder, the present invention provides a process using an amine compound having a molecular weight of 100 to 1,000 as an organic compound having one or more unsaturated bond in one molecule, in the presence of which silver particles are precipitated by subjecting a silver compound to reduction treatment, in an alcohol or an polyol using the alcohol or the polyol as a reducing agent.

According to the present invention, it is possible to provide a silver nano-ink having high silver concentration and good dispersibility of silver particles. This realizes extremely high silver concentration than the conventional silver nano-ink, and formation of imperceptible interconnection by an inkjet method can be made remarkably efficient.

PREFERRED EMBODIMENT OF THE INVENTION

Figure 1:
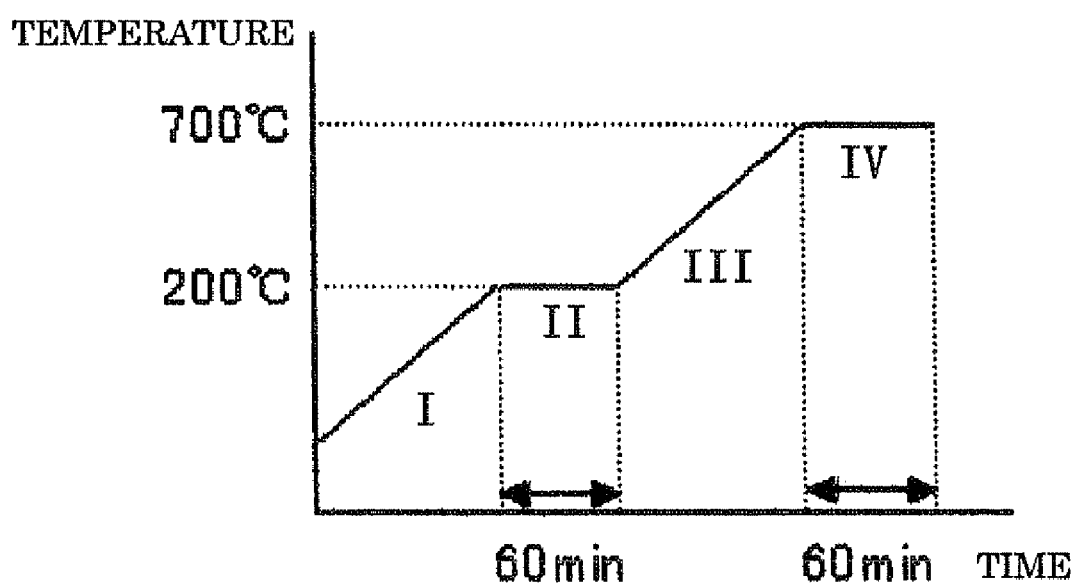
FIG. 1 is a view schematically showing heat pattern by TG-DTA apparatus employed to measure the proportion of an organic protective material.

The present inventors have developed a silver fine powder comprising silver nanoparticles covered with an organic protective material, as a silver fine powder showing extremely excellent dispersibility in an organic solvent. With the progress of investigations, it has been found that even in the silver fine powder, precipitation is generated in preparing an ink having a certain high concentration or more, and it is difficult to increase the silver concentration in an ink. In view of this, investigations have been made to provide particles ensuring good dispersibility even in higher concentration. As a result, the inventors succeeded to dramatically increase the silver concentration in an ink by reducing the amount of an organic protective material in the silver fine powder within a prescribed range.

The silver fine powder of the present invention has the proportion of an organic protective material to the total of the silver particles and the organic protective material (hereinafter simply referred to as an "organic protective material proportion") adjusted to 0.05 to 25% by mass. Where the organic protective material proportion is too low, aggregation of particles is liable to cause, and it becomes difficult to prepare even an ink having low concentration. On the other hand, where the organic protective material proportion is too high, the silver concentration in the ink cannot be improved. To obtain a silver nano-ink having high silver concentration of 10% by mass or more, it is extremely effective to adjust the organic protective material proportion in the above range. Furthermore, when such silver fine powder is used, it is possible to prepare an ink having the silver concentration of 30% by mass or more, an ink having the silver concentration of 50% by mass or more, or an ink having the silver concentration of 60% by mass or more (see Examples described hereinafter). Therefore, the present invention is aimed at the silver fine particles whose organic protective material proportion is 0.05 to 25% by mass. The silver fine particles whose organic protective material proportion calculated by a measurement method described hereinafter is 1 to 20% by mass are more preferred. The organic protective material proportion may be controlled to about 3 to 15% by mass. Furthermore, the organic protective material proportion can mainly be controlled by adjusting the amount of an organic compound present in a liquid at the time of reduction reaction in a production process described hereinafter.

The silver fine powder of the present invention can be produced by the following step (a), and the ink of the present invention can be produced by further conducting the following step (b).

(a) A step of reduction by mixing a silver compound, an alcohol or a polyol, and an organic compound (such as unsaturated amines), rising the temperature, and promoting reduction reaction of silver ions in a liquid (in some cases, a reducing agent may separately be added in the course of the reaction in order to accelerate reduction), and (b) a step of forming an ink having a silver fine powder dispersed in an organic solvent mainly comprising a linear alkane, by dispersing the silver fine powder separated and recovered from the mother liquor of step (a) in the organic solvent. Each step is described below.

(a) Reduction Step

The reduction step is a step of reducing a silver compound, particularly a silver salt, dissolved in a solvent of an alcohol or a polyol, having reducing power, thereby forming a silver fine powder. This step uses an alcohol or polyol which is a solvent, as a reducing agent.

In the course of the reduction reaction, it is important that an organic compound coexists in a liquid. The organic compound is to constitute an organic protective material of the silver fine particles later. The organic compound includes polymer compounds, amines and fatty acids. Above all, amines, particularly amines having an unsaturated bond, are preferably used. According to the investigations by the present inventors, in a method of directly precipitating silver from a high homogeneity solvent having a silver salt dissolved therein as in the reduction step, when an organic compound that does not have an unsaturated bond is used, a silver fine power has not been synthesized yet. Contrary to this, it has been found that when an organic compound having an unsaturated bond is used, a silver fine powder having the surface protected with the organic compound is synthesized. The reason for this is not sufficiently clarified, but it is estimated at the present time that the organic compound is adsorbed on the surface of the precipitated silver by the influence of the unsaturated bond possessed by the organic compound, the organic compound exhibits the function as a protective material acting such that the reduction of silver ion does not proceed more than a certain level, and as a result, growth of particles of silver is suppressed, producing silver nanoparticles. Furthermore, it has been confirmed that dispersibility to an organic solvent can sufficiently be ensured even though the unsaturated bond is present.

According to the finding by the present inventors, it suffices that in this case at least one unsaturated bond is present in one molecule of the organic compound. The number of carbon atoms in the organic protective material present on the surface of silver particles can be adjusted by increasing the number of unsaturated bond. Therefore, an organic compound having different number of unsaturated bond may be added, if required.

The organic compound used has a molecular weight of 100 to 1,000, and preferably 100 to 400. Where the molecular weight is too large, boiling point becomes higher, and dissipation of the organic protective material is difficult to occur at the time of burning after ink coating. As a result, the coating film prepared by an inkjet method contains a large amount of impurities. Furthermore, in the ink, the weight of an organic material present on the surface of silver particles is increased, and this is disadvantageous in obtaining an ink having high silver concentration.

The amount of the organic compound (such as amine) co-present in a solvent at the time of reduction reaction can be 0.1 to 20 equivalents to silver. The amount of 1.0 to 15 equivalents is preferred, and the amount of 2.0 to 10 equivalents is further preferred. Where the amount of the organic compound used is too small, the amount of the organic protective material on the surface of silver particles is insufficient, and dispersibility in a liquid cannot sufficiently be ensured. Where the amount is too large, the relative proportion of silver in the ink is decreased, and additionally, the cost of the organic compound is increased. Those are not preferred from the industrial standpoint. For example, when the amount of an amine added is 25 equivalents to silver, the theoretical silver concentration in a liquid is diluted to about 0.1 mol/liter. This concentration corresponds to the concentration ratio of about 1/2 when conducted at 10 equivalents.

An alcohol or a polyol, which is a solvent, is used as the reducing agent. The use of the reducing agent can bring silver nanoparticles having less contamination of impurities. In conducting reaction, it is efficient to perform a reflux operation. For this reason, it is preferred that the boiling point of the alcohol or the polyol is low. Specifically, the boiling point is 300° C. or lower, preferably 200° C. or lower, and more preferably 150° C. or lower. It is preferred that the alcohol has a longer carbon chain as possible from the standpoint of reducing properties.

The alcohol that can be used includes propyl alcohol, n-butanol, isobutanol, sec-butyl alcohol, hexyl alcohol, heptyl alcohol, octyl alcohol, allyl alcohol, crotyl alcohol and cyclopentanol. The polyol that can be used includes diethylene glycol, triethylene glycol and tetraethylene glycol. Of those, isobutanol and n-butanol are preferred.

It is desired that the temperature of the reduction reaction is in a range of 50 to 200° C. Where the reaction temperature is too low, reducing action of alcohols is difficult to be exhibited, and the reaction is difficult to proceed. Additionally, poor reduction may be generated. Where the reaction temperature is too high, reduction proceeds excessively, and coarsening of particles and scattering of particle diameter may be increased. In inkjet applications it is preferable to form silver fine particles of an average particle diameter $D_{TEM}$ (described hereinafter) of 20 nm or less. The reaction temperature is more preferably 50 to 150° C., and further preferably 60 to 140° C. Specifically, when the reaction temperature is controlled to, for example, a range of 80 to 130° C., better result is obtained.

As the case may be, the reduction can be carried out in multiple steps. That is, when the reduction proceeds rapidly, growth of particles may be too remarkable. To effectively control the particle diameter, the reduction is first conducted at low temperature, and thereafter the reaction is allowed to proceed by changing the temperature to higher temperature or gradually increasing the temperature. In this case, where the temperature difference is large, remarkable change may possibly occur in particle size distribution. Therefore, it is desired that the difference between the lowest temperature and the highest temperature is within 20° C. It is further preferred to strictly control the difference within 15° C., and further within 10° C.

In the case that silver salt may possibly be not sufficiently reduced even at a high temperature, it is effective to add fresh organic compound in order to reduce the remaining silver salt. In this case, it is sufficient so long as reduction of the remaining silver salt proceeds, and it is not necessary to use the same kind of organic compound as the organic compound previously used. Specifically, secondary amines and tertiary amines, having reducing power, are added. The reaction temperature may be the same temperature before newly adding the organic compound, or may slightly be changed.

(b) Formation of Ink having Silver Fine Powder Particles Dispersed therein

The liquid having the obtained silver fine powder particles included therein possibly includes reaction residues and the like therein. Therefore, a step of separating particles and a reaction mother liquor to obtain a colloidal liquid. Specifically, the silver fine powder formed through the reduction reaction is dispersed in an organic solvent through each step of cleaning, dispersion, classification and adjustment, to obtain an ink.

Steps for obtaining an ink are exemplified below.

<Cleaning Step>

[1] Slurry after reaction is solid-liquid separated by a decantation method or a centrifugal separator, and a supernatant is disposed.

[2] Methanol is added to a solid content (product) after solid-liquid separation, and ultrasonic dispersion is applied to the resulting mixture, thereby cleaning and removing impurities adhered to the surface of the product.

[3] [1] and [2] above are repeated several times to remove impurities on the surface as much as possible.

[4] Finally, [1] is again performed, and the supernatant is disposed, thereby collecting the solid content.

Those steps are repeated. In the Examples described hereinafter, those steps are repeated three times.

The amount of silver fine powder thus formed (the amount containing the organic protective material present on the surface) is determined by the following procedures.

(i) Weight of slurry after the reaction but before subjecting to [1] above is measured, and this weight is used as a weight value A.

(ii) A sample (for example, 40 ml) is collected from the slurry, its weight is measured, and the weight is used as a weight value B.

(iii) A solid content is collected from the sampled 40 ml of the slurry according to [2] to [4] above, placed in a vessel having a known weight, and then vacuum dried at 200° C. for 12 hours. The weight of the dried product obtained is measured, and is used as a weight value C.

(iv) The amount D of silver fine powder formed (the amount containing the organic protective material present on the surface) is calculated by D=C×(A/B).

In the present description, the term "degree of reduction" as an index of progress of reduction reaction is calculated by the ratio of D above to silver weight E contained in silver salt before initiation of reaction. That is, Degree of reduction (%)=D/E×100

The value of degree of reduction shows the proportion of silver that can be recovered as a reaction product. When silver is completely reduced, the mass of the silver fine powder is a value including the organic protective material, and therefore may show high degree of reduction exceeding 100%. According to the finding of the present inventors up to the present time, it is confirmed that the silver fine powder according to the present process shows the degree of reduction of about 85 to 105%.

<Dispersion Step>

[1] The solid content obtained after the above cleaning step is added to any one of the solvents described below, or a dispersion medium prepared by combining those.

(Dispersion Medium)

The dispersion medium is a non-polar or un-polar organic solvent, and specifically an organic solvent having a dielectric constant at 25° C. of 15 or less. For example, aliphatic hydrocarbons such as isooctane, n-decane, n-undecane, n-tetradecane, n-dodecane, tridecane, hexane and heptane; and aromatic hydrocarbons such as benzene can preferably be used. Different kind of a dispersion aid such as amine group can be added to the dispersion medium so long as the addition amount thereof does not exceed the above conditions.

[2] The mixture is then subjected to ultrasonic dispersion to disperse the solid content in the dispersion medium.

<Classification Step>

An ink of the silver particles obtained through the dispersion step is subjected to centrifugal separation at 3,000 rpm for 30 minutes to separate a supernatant and a precipitate. The ink intended in the present invention is prepared by using the supernatant obtained at this stage.

The ratio of the amount of the silver contained in the supernatant above to the amount of the precipitate is called herein "dispersion efficiency", and is defined below. This also corresponds to recovery efficiency of nanoparticles.

Dispersion efficiency (%)=([weight (D above) of silver fine powder formed in cleaning step]−[weight of particles adhered on wall surface of vessel after centrifugal separation])/[weight (D above) of silver fine powder formed in cleaning step]×100

The residual amount of silver adhered to the wall surface can be measured by vacuum drying at 200° C. for 6 hours after separation and recovery of a liquid. The dispersibility as dispersed colloid of particles is high when the dispersion efficiency is higher. The value is desirably 60% or more, more preferably 70% or more, and further preferably 80% or more.

<Adjustment Step>

The silver particle dispersion liquid (supernatant) obtained in the classification step is subjected to a vacuum drier, and is concentrated until a liquid is not confirmed. The condensate is dispersed in the dispersion medium described above to form an ink having a concentration appropriately adjusted. As the case may be, it is possible to obtain an ink of silver concentration of about 90% by mass.

The ink obtained through the above steps is a silver nanoparticle colloidal liquid which is difficult to generate scale factor even though scale is enlarged, and has stable properties.

Properties of the silver fine powder or ink according to the present invention, and the measurement methods thereof are described below.

[Average Particle Diameter $D_{TEM}$]

The present invention employs an average particle diameter $D_{TEM}$ determined by TEM (transmission electron microscope) as the average particle diameter of silver particles. That is, of the particles observed at the magnification of 600,000 by TEM, particle diameters of non-overlapped and independent 300 particles are measured, and its average particle diameter is calculated. The silver fine powder intended in the present invention has $D_{TEM}$ of 20 nm or less, more preferably 15 nm or less, and further preferably 10 nm or less. The smaller average particle diameter is advantageous in forming imperceptible interconnection. In the Examples described hereinafter, JEM-2010, a product of JEOL Ltd., was used as TEM.

[X-Ray Crystallite Diameter Dx]

The X-ray crystallite diameter is calculated by Scherrer's equation using diffraction line (2θ=38.115°) on Ag (111) plane by Cu tube with an X-ray diffraction apparatus. The constant used in the Scherrer's equation is 0.94. X-ray crystallite diameter calculated here is better to be smaller. The diameter is preferably 20 nm or less, more preferably 15 nm or less, and further preferably 10 nm or less. X-ray diffraction apparatus RAD-rB, a product of Rigaku Corporation, was used in the Examples described hereinafter.

[Monocrystallinity $D_{TEM}/D_X$]

The value obtained by dividing the average particle diameter $D_{TEM}$ by the X-ray crystallite diameter Dx is defined as monocrystallinity. This is a value indicating how far the particle diameter visually conformed and the crystallite diameter are deviated from each other. From this value, it can be evaluated how many crystals constitute the actually measured particle. Where the value is too large, particles aggregate and monocrystal cannot be formed, which is not preferred.

[Proportion of Organic Protective Material Present on Silver Particle Surface]

The proportion of the organic protective material present on the silver particle surface (hereinafter referred to as "organic protective material proportion") is calculated according to a chart calculated by TG-DTA apparatus. Where the proportion is too high, the surface of the particle is covered with an organic material in multilayers, and it is difficult to improve not only dispersibility but silver concentration above a certain level, which is not preferred. On the other hand, where the proportion is too low, the recovery efficiency of silver fine powder is decreased, which is not preferred. The specific value of the preferred organic protective material proportion is as described before.

Heat pattern shown in FIG. 1 is employed to calculate the organic protective material proportion. That is, temperature is first elevated from room temperature to 200° C. at a rate of 10° C./min (stage I), then kept at 200° C. for 60 minutes (stage II), thereby volatilizing the organic solvent contained in the dispersion. Then, the temperature is elevated from 200° C. to 700° C. at a rate of 10° C./min (stage III), kept at 700° C. again for 60 minutes (stage IV). It can be considered that in the stages I and II, all of the organic solvent evaporates, and the organic protective material remains; and in the stages III and IV, all of the organic protective material volatilizes. Change in weight measured by TG-DTA apparatus by the heat pattern of FIG. 1 is monitored, and the weight change becomes substantially zero until completion of the stage II. Therefore, weight portion $W_1$ decreased until this time is considered as weight of the organic solvent (dispersion medium). After initiation of the stage III, the weight decrease again, and the weight change becomes substantially zero until completion of the stage IV. Therefore, weight portion $W_2$ newly decreased during the stages III and IV is considered as the weight of the organic protective material. The remaining weight $W_3$ is considered as the net weight of silver.

The organic protective material proportion is calculated by $W_2/(W_2+W_3)$.

The silver concentration in the ink is calculated as a ratio of the amount of silver obtained at the final stage of TG measurement to the total weight of the ink (colloidal liquid), and can be obtained by analyzing the ink with ICP.

[Viscosity]

According to the present invention, a silver nano-ink of low viscosity is obtained. The viscosity in the Examples was measured under the condition of 25° C. by fitting a cone rotor 0.8° on R550 type Viscometer RE550L, a product of Toki Sangyo Co., Ltd. In this case, the viscosity of an ink is desirably 50 mPa·s or less, and more preferably 40 mPa·s or less, in the application of the ink to interconnection formation using an inkjet method. For example, the viscosity is adjusted to a range of 0.1 to 40 mPa·s, and preferably a range of 0.1 to 20 mPa·s. When the silver nanoink having the viscosity adjusted within this range is used, clogging of nozzles is difficult to occur, making it possible to smoothly form droplets. The lower limit of the viscosity can be defined to 1 mPa·s or more according to the intended use.

[Yield]

Finally, "yield" is determined as an index showing what amount of silver is dispersed in an ink after the classification step. That is, the yield is defined as follows.

Yield(%)=(Degree of reduction/100)×(Dispersion efficiency/100)×100

This means that when the yield is high, particles are obtained in high degree of reduction and high dispersion is shown.

EXAMPLES

Examples 1 and 2

Isobutanol (special grade reagent, a product of Wako Pure Chemical Industries, Ltd.) was used as an organic solvent having reducing power, and oleyl amine (special grade reagent, a product of Wako Pure Chemical Industries, Ltd.) as an organic protective material was mixed therewith. Silver nitrate crystal (special grade reagent, a product of Wako Pure Chemical Industries, Ltd.) as a silver compound was added to the resulting mixture, followed by stirring with a magnetic stirrer, thereby dissolving the silver nitride crystal. In this procedure, the amount of silver nitrate used was 20.59 g, the amount of isobutyl alcohol used was 96.24 g, and the amount of oleyl amine used was 165.5 g. In this case, the amount of the oleyl amine as the organic protective material corresponds to 5 equivalents to silver.

The solution thus obtained was transferred to a 300 ml vessel having a reflux apparatus connected thereto. While adding nitrogen as an inert gas to the vessel in an oil bath at a flow rate of 400 ml/min, the solution was stirred at 100 ppm. During stirring, the liquid temperature was elevated to 108° C. at a temperature-rising rate of 2° C./min. Heating was then conducted while refluxing for 300 minutes, and the reaction was allowed to proceed. After completion of the reaction, a silver nano-ink was obtained through the steps of cleaning, dispersion and classification described above. The kind of the solvent of ink was dodecane in Example 1 and tetradecane in Example 2.

The degree of reduction of the obtained particles was 101.7%. The Dx value was 8.1 nm, the average particle diameter $D_{TEM}$ was 9.5 nm, and the crystallinity was 1.18. Thus, it is seen that reduction was efficiently conducted, and silver fine powder having low crystallinity was obtained. Properties of the ink are shown in Table 1.

TABLE 1

| Example No. | Dispersion medium | Silver concentration in ink (mass %) | Proportion of organic protective material (mass %) | Dispersion efficiency (%) | Viscosity (mPa·s) |
|---|---|---|---|---|---|
| Example 1 | Dodecane | 54.1 | 10.9 | 95.7 | 3.6 |
| Example 2 | Tetradecae | 64.2 | 5.1 | 90.9 | 17.9 |

In these inks, the organic protective material proportion was adjusted low, and thus, inks having very high silver particle concentration were obtained. The target of silver particle concentration was 65% in Example 1 and 75% in Example 2. The silver particle concentration was obtained by analyzing the ink with ICP mass spectrometer.

Comparative Examples 1 and 2

Inks were prepared in the same manner as in Examples 1 and 2. However, regarding raw materials, the amount of silver nitrate used was 27.80 g, the amount of isobutyl alcohol used was 43.31 g, and the amount of oleyl amine used was 201.03 g. In this case, the amount of the oleyl amine as the organic protective material corresponds to 4.5 equivalents to silver.

The degree of reduction of the obtained particle was 110.0%. The Dx value was 4.9 nm, the average particle diameter $D_{TEM}$ was 8.4 nm, and the crystallinity was 1.71. Thus, it is seen that reduction was efficiently conducted, and silver fine powder having low crystallinity was obtained. Properties of the ink are shown in Table 2. In Comparative Examples 1 and 2, the same ink formation operation (dispersion operation to dodecane) was conducted in different occasion.

TABLE 2

| Example No. | Dispersion medium | Silver concentration in ink (mass %) | Proportion of organic protective material (mass %) | Dispersion efficiency (%) | Viscosity (mPa·s) |
|---|---|---|---|---|---|
| Comparative Example 1 | Dodecane | 3.5 | 81.4 | 28.5 | 1.3 |
| Comparative Example 2 | Dodecane | 6.9 | 75.9 | 58.3 | 1.5 |

The target of silver concentration was 65% in these Comparative Examples, but only inks having silver concentration greatly lower than the target were obtained. According to TEM observation, these silver particles had uniform shape, and the average particle diameter $D_{TEM}$ of 8.4 nm, and thus were nanoparticles. However, only about 30 to 60% of the formed particles could be dispersed in the ink. This is considered due to the following reasons. Despite that the concentration of silver charged in Comparative Examples 1 and 2 was higher than that in Examples 1 and 2, the cleaning step was carried out in the same way as in Examples 1 and 2, and thus cleaning of particles became insufficient, and as a result, a large amount of the organic protective material remained on the surface of the particles.

Comparative Examples 3 and 4

In Example 1, cyclohexyl amine (Comparative Example 3) and ethylhexyl amine (Comparative Example 4) were used as the organic protective material in place of oleyl amine. These organic materials do not have an unsaturated bond. The experiment was conducted under the same conditions as in Example 1, except for the above. As a result, formation of particles was not substantially observed, and even properties of particles could not be confirmed. The rate of reduction was 3.9% in the case of cyclohexyl amine and 3.8% in the case of ethylhexyl amine. However, the yield was 0% in both Comparative Examples 3 and 4, and silver particles dispersed in the dispersion medium could not be observed.

The invention claimed is:

1. An ink comprising particles of the silver fine powder dispersed in an organic solvent, wherein the silver powder comprises silver particles with an average particle diameter of 20 nm or less and having an amine compound as an organic protective material on the surface thereof, the proportion of the organic protective material present being 3 to 15% by mass based on the total mass of the silver particles and the organic protective material, the silver concentration in the ink being 50% by mass or more, and the ink has a viscosity of 50 mPa·s or less.

2. A process for producing an ink of a silver fine powder dispersed in an organic solvent, comprising using an amine compound having a molecular weight of 100 to 1,000 as an organic compound having one or more unsaturated bond in one molecule in precipitating silver particles by subjecting a silver compound to reduction treatment in the presence of the organic compound in an alcohol or a polyol using the alcohol or the polyol as a reducing agent, thereby obtaining silver particles with an average particle diameter of 20 nm or less and the organic protective material on the surface thereof in the proportion of the organic protective material present of 3 to 15% by mass based on the total mass of the silver particles and the organic protective material, and dispersing the resultant silver particles having the organic protective agent in an organic solvent so as to have a silver concentration of 50% by mass or more, with the ink having a viscosity of 50 mPa·s or less.

3. An ink according to claim 1, wherein the amine compound has a molecular weight of 100 to 1,000 and one or more unsaturated bond in one molecule.

4. An ink according to claim 1, wherein the viscosity of the ink is 0.1 to 20 mPa·s.

5. An ink according to claim 1, wherein the organic solvent is at least one selected from the group consisting of isooctane, n-decane, n-undecane, n-tetradecane, n-dodecane, tridecane, hexane, and heptane.

6. The process according to claim 2, wherein the amine compound has a molecular weight of 100 to 1,000 and one or more unsaturated bond in one molecule.

7. The process according to claim 2, wherein the viscosity of the ink is 0.1 to 20 mPa·s.

8. The process according to claim 2, wherein the organic solvent is at least one selected from the group consisting of isooctane, n-decane, n-undecane, n-tetradecane, n-dodecane, tridecane, hexane, and heptane.

* * * * *